(12) United States Patent
Liu

(10) Patent No.: US 8,525,593 B2
(45) Date of Patent: Sep. 3, 2013

(54) CIRCUIT AND METHOD FOR AMPLIFYING A DIGITAL SIGNAL

(75) Inventor: QiYu Liu, Shenzhen (CN)

(73) Assignee: STMicroelectronics (Shenzhen) R&D Co. Ltd., Shenzhen (CN)

(*) Notice: Subject to any disclaimer, the term of this patent is extended or adjusted under 35 U.S.C. 154(b) by 41 days.

(21) Appl. No.: 13/313,328

(22) Filed: Dec. 7, 2011

(65) Prior Publication Data

US 2012/0169420 A1 Jul. 5, 2012

(30) Foreign Application Priority Data

Dec. 29, 2010 (CN) .......................... 2010 1 0624731

(51) Int. Cl.
*H03F 3/217* (2006.01)

(52) U.S. Cl.
USPC ........................ 330/251; 330/207 A

(58) Field of Classification Search
USPC ........................... 330/10, 251, 207 A
See application file for complete search history.

(56) References Cited

U.S. PATENT DOCUMENTS

| | | | | |
|---|---|---|---|---|
| 5,604,510 A | * | 2/1997 | Blanchard | 345/98 |
| 6,356,151 B1 | * | 3/2002 | Nalbant | 330/251 |
| 6,384,678 B2 | * | 5/2002 | Berkhout | 330/10 |
| 6,448,851 B1 | * | 9/2002 | McIntosh et al. | 330/207 A |
| 6,603,291 B2 | * | 8/2003 | Wheeler et al. | 323/224 |
| 6,763,114 B1 | * | 7/2004 | Nalbant | 381/120 |
| 7,173,483 B2 | * | 2/2007 | Ho et al. | 330/10 |
| 7,889,003 B2 | * | 2/2011 | Basten | 330/251 |
| 2009/0021305 A1 | * | 1/2009 | Komatsu | 330/251 |
| 2010/0109773 A1 | * | 5/2010 | Takagi | 330/251 |

* cited by examiner

*Primary Examiner* — Henry Choe
(74) *Attorney, Agent, or Firm* — Gardere Wynne Sewell LLP

(57) ABSTRACT

An amplifier circuit includes an amplifier unit that is configured to receive an input signal and generate a switching output signal. A level shifter is configured to shift the amplitude of the input signal to have a shifted amplitude that is proportional to a peak-to-peak amplitude of the switching output signal.

21 Claims, 3 Drawing Sheets

US 8,525,593 B2

CIRCUIT AND METHOD FOR AMPLIFYING A DIGITAL SIGNAL

PRIORITY CLAIM

This application claims priority from Chinese Application for Patent No. 201010624731.5 filed Dec. 29, 2010, the disclosure of which is hereby incorporated by reference.

TECHNICAL FIELD

This disclosure relates generally to electronic circuits, and more particularly to a circuit and method for amplifying a digital signal, as well as an audio amplifier circuit comprising the circuit for amplifying a digital signal.

BACKGROUND

In the audio power amplifier field, the customer demands lower cost solutions without sacrificing performance. Class-D audio amplifiers have great efficiency and eliminate heat sinks, significantly reducing overall system cost and size. Class-D audio amplifiers are becoming quite popular because of the above advantages. Generally, Class-D audio amplifiers are classified into two types according the two different input types: analog and digital.

The analog Class-D amplifiers usually use negative feedback structure, which can improve the Total Harmonic Distortion (THD) and Power Supply Rejection Ratio (PSRR).

In the prior art, most the digital input Class-D amplifiers use open-loop structures, which have an output duty cycle that is equal to the input duty cycle. The gain of open-loop digital Class-D is dependent on the power supply voltage Vcc, and the input and output can reach full scale range at different Vcc. However, the open-loop digital Class-D amplifier has poor PSRR, since the duty cycle does not change to compensate for ripple in the power supply voltage.

Nowadays, increasingly applied digital audio signal processing makes it more convenient to use a digital input audio power amplifier rather than an analog input. The digital input Class-D amplifier with close-loop structure is therefore proposed for better performance of THD and PSRR. Audio digital power amplifier circuits usually have multiple power supplies, the input PWM signal is logic level, and the output power driver stage has a wide operative power supply range. The voltage gain of the closed-loop digital Class-D is determined by the feedback loop, when the amplifier circuit is determined, the gain is fixed. The full scale input duty cycle is about from 0 to 100%, but the output duty cycle is different at different output power supply voltage Vcc even when the input duty cycles are the same, since the voltage gain of the negative feedback loop is fixed. The drawback is that the closed-loop structure with fixed gain cannot reach linear full scale input and output duty cycle range at different power supply voltage. The output will be clipped early at low Vcc, and cannot reach full scale duty cycle at high Vcc. Thus, the audio signal carried by the duty cycle of the input PWM signal will be distorted early at low Vcc, and the output power is limited by the gain at high Vcc.

There is a need in the art to realize the full scale input and output range of a digital Class-D circuit with wide output power supply voltage range.

SUMMARY

In one embodiment of the disclosure, an amplifier circuit is provided with an amplifier unit configured to receive an input signal and to generate a switching output signal, and a level shifter configured to shift the input signal to have a shifted amplitude proportional to the peak-to-peak amplitude of the switching output signal.

In one embodiment of the disclosure, the amplifier unit is of negative feedback class-D amplifier structure, thus the duty cycle of the switching output signal is proportional to that of the input signal and the analog signal carried by the duty cycle could be regenerated without distortion.

In one embodiment of the disclosure, the amplifier unit is of negative feedback class-D amplifier structure, and the voltage gain of the level shifter is configured to be approximately equal to a ratio between the peak-to-peak amplitude of the switching output signal and the product of the amplitude of the input signal and the voltage gain of the negative feedback class-D amplifier unit. Thus, the duty cycle of the switching output signal is equal to that of the signal and full scale input and output range is achieved.

In one embodiment of the disclosure, the input signal and the switching output signal of the amplifier circuit both are PWM signals.

In one embodiment of the disclosure, the negative feedback class-D amplifier unit in the amplifier circuit comprises a first order integrator.

In one embodiment of the disclosure, the negative feedback class-D amplifier unit in the amplifier circuit comprises a second order integrator.

In one embodiment of the disclosure, the amplifier circuit further comprises a delay unit configured to delay the switching output signal for the duration of 3 to 8 percent of the input signal cycle. Thus, unexpected spurs could be eliminated and the amplifier circuit could work more stably.

In one embodiment of the disclosure, the delay duration of the delay unit of the amplifier circuit is 4 to 6 percent of the input signal period.

In one embodiment of the disclosure, the amplifier circuit further comprises a delay unit configured to delay the switching output signal for a duration greater than $T/(2+(|I1|+|I2|)/(|I2|-|I1|))$. Wherein, T is the cycle of the switching output signal, and I1 is the input current of the negative feedback class-D amplifier unit, and I2 is the feedback current of the negative feedback class-D amplifier unit. Thus, unexpected spurs could be eliminated and the amplifier circuit could work more stably.

In one embodiment of the disclosure, the negative feedback class-D amplifier unit of the amplifier circuit comprises a full-bridge.

In one embodiment of the disclosure, an audio amplifier circuit comprises a PWM modulator, a digital amplifier circuit and a low pass filter. The PWM modulator is configured to convert an analog audio signal into a PWM signal. The digital amplifier circuit comprises a negative feedback class-D amplifier unit configured to receive the PWM signal and to generate a switching output signal, and a level shifter, configured to shift the PWM signal to have a shifted amplitude proportional to the peak-to-peak amplitude of the switching output signal. The low pass filter is configured to filter the switching output signal so as to output a regenerative analog audio signal. The duty cycle of the switching output signal is proportional to that of the input PWM signal and the analog signal carried by the duty cycle could be regenerated without distortion.

In one embodiment of the disclosure, the voltage gain of the level shifter is configured to be approximately equal to a ratio between the peak-to-peak amplitude of the switching output signal and the product of the amplitude of the input signal and the voltage gain of the negative feedback class-D amplifier unit. Thus, the duty cycle of the switching output signal is equal to that of the input PWM signal and full scale duty cycle range of input and output is achieved.

In one embodiment of the disclosure, the audio amplifier circuit further comprises a delay unit configured to delay the switching output signal for the duration of 3 to 8 percent of the cycle period of the input PWM signal. Thus, unexpected spurs to the switching output signal could be eliminated and the audio amplifier circuit could work more stably.

In one embodiment of the disclosure, the audio amplifier circuit further comprises a delay unit configured to delay the switching output signal for a duration greater than $T/(2+(|I1|+|I2|)/(|I2|-|I1|))$. Wherein, T is the cycle of the switching output signal, and I1 is the input current of the negative feedback class-D amplifier unit, and I2 is the feedback current of the negative feedback class-D amplifier unit. Thus, unexpected spurs to the switching output signal could be eliminated and the audio amplifier circuit could work more stably.

In one embodiment of the disclosure, the negative feedback class-D amplifier unit in the audio amplifier circuit comprises a full-bridge.

In one embodied manner of the disclosure, a method comprises the steps of: receiving an input signal and generating a switching output signal by a negative feedback class-D amplifier unit; and shifting the amplitude of the input signal to a value proportional to the peak-to-peak amplitude of the switching output signal of the negative feedback class-D amplifier circuit. Thus, the duty cycle of the switching output signal is proportional to that of the input signal and the analog signal carried by the duty cycle could be regenerated without distortion.

In one embodiment of the disclosure, in the shifting step of the method of amplifying a digital signal, the input signal is shifted to a value approximately equal to a ratio between the peak-to-peak amplitude of the switching output signal and the voltage gain of the negative feedback class-D amplifier unit. In this manner, the duty cycle of the switching output signal is equal to that of the input signal and full scale duty cycle range of input and output is achieved.

In one embodiment of the method of amplifying a digital signal, the input signal and the switching output signal are both PWM signal.

In one embodiment of the disclosure, the method of amplifying a digital signal further comprises a step: delaying the switching output signal for the duration of 3 to 8 percent of the input signal cycle.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF THE DRAWINGS

The making and using of embodiments are discussed in detail below. It should be appreciated, however, that the specific embodiments discussed are merely illustrative, and do not limit the scope of the disclosure.

Figure 1:
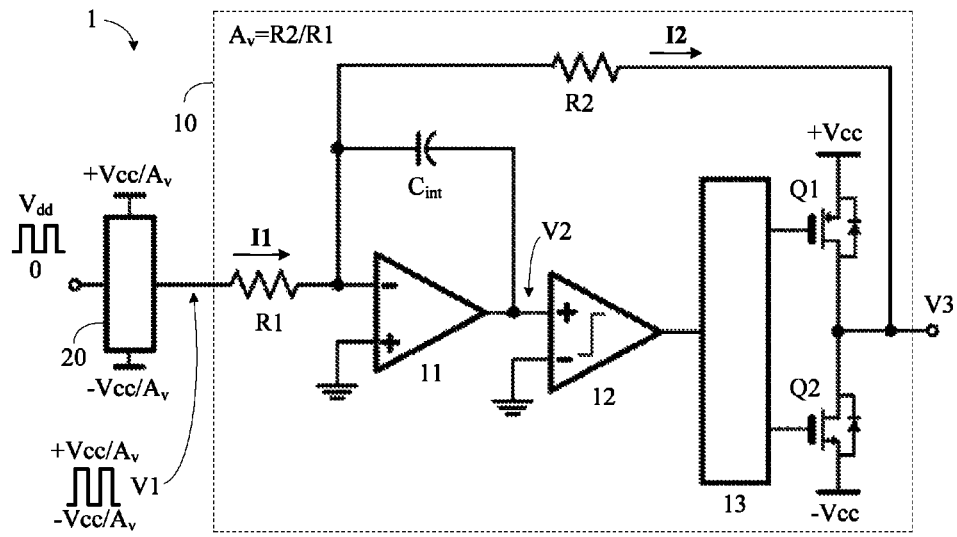
FIG. 1 illustrates an amplifier circuit according to an embodiment.

FIG. 1 illustrates an amplifier circuit 1 according to an embodiment. The amplifier circuit 1 comprises an amplifier unit 10 and a level shifter 20 that is coupled to the input of the amplifier unit 10. In this embodiment, the amplifier unit 10 is of negative feedback class-D amplifier structure. In some other embodiments, the amplifier unit 10 is of open loop class-D structure.

The negative feedback class-D amplifier unit 10 is configured to receive a switching input signal and to generate a switching output signal. Generally, the switching input signal is a PWM signal, therefore the switching output signal is a PWM signal as well. Alternatively, the switching input signal could be a square wave signal with variable cycle period, and then the switching output signal is of the same kind.

To be specific, the negative feedback class-D amplifier unit 10 comprises a first order integrator consisting of the op amp 11 and the capacitor $C_{int}$, a comparator 12, a power driver 13, two transistors Q1 and Q2, two resistors R1 and R2. The resistor R1 is connected between input and the inverse input of the op amp 11. The comparator 12 is configured to receive the output of the integrator. The power driver 13 is configured to receive the output of the comparator 12 and to drive the upper transistor Q1 and the lower transistor Q2. The switching output signal is produced from the middle point of the upper transistor Q1 and the lower transistor Q2. The feedback branch including the resistor R2 provides the feedback from the switching output signal to the input of the integrator. When the amplifier circuit unit is determined, the voltage gain is fixed, herein the voltage amplifying gain is $A_V = R2/R1$. Since the output stage consisting of the upper transistor Q1 and the lower transistor Q2 is powered with bipolar bias voltage Vcc, the peak-to-peak amplitude of the switching output signal is double Vcc.

The level shifter 20 is coupled to the input of the negative feedback class-D amplifier unit 10, and is configured to shift the amplitude of the switching input signal to have a shifted amplitude proportional to the peak-to-peak amplitude of the switching output signal. It is understood by those skilled in the art that the power supply voltage Vcc is one of the control parameters or input parameters of the level shifter 20 for the above purpose. The bipolar power supply voltage of the level shifter 20 is set substantially equal to the power supply voltage Vcc divided by the gain Av of the amplifier.

Since the shifted amplitude input signal has a shifted amplitude proportional to the peak-to-peak amplitude of the switching output signal and the voltage gain of the negative feedback loop is fixed, the duty cycle of the switching output signal is accordingly proportional to that of the input signal. Therefore, the analog signal carried by the duty cycle of the input signal could be restored by filtering the switching output signal without distortion. Because of the negative feedback working model, better THD and PSRR performance is achieved by the amplifier circuit 1, and a power supply with high performance is dispensable.

In one embodiment of the disclosure, the amplifier unit is of negative feedback class-D amplifier structure, and the voltage gain of the level shifter 20 is configured to be approximately equal to a ratio between the peak-to-peak amplitude of the switching output signal and the product of the amplitude of the input signal and the voltage gain of the negative feedback class-D amplifier unit.

In the case that the amplitude of the input signal is Vdd, and the voltage gain (i.e., feedback gain) of the negative feedback class-D amplifier unit 10 is $A_V$, and the peak-to-peak amplitude of the switching output signal is double Vcc, then the peak-to-peak amplitude of output of the level shifter 20 is $2 \times Vcc/A_V$, namely the voltage gain of the level shifter 20 is $2 \times Vcc/(A_V \times V_{dd})$. Therefore, the total voltage gain of the amplifier circuit 1 is: Gain=$2 \times Vcc/V_{dd}$, which is dependent on the input logic voltage $V_{dd}$ and the output power supply voltage Vcc, thus the full scale duty cycle range of input and output is achieved in the amplifier circuit 1 as the open-loop class-D. It will be appreciated by those skilled in the art that the voltage amplifying gain (or the power amplifying gain) of the negative feedback class-D amplifier unit 10 and the power supply voltage Vcc (or the peak-to-peak amplitude of the switching output signal) are both the control parameters or input parameters of the level shifter 20 for the above purpose. The control parameter Vcc of the level shifter 20 can be generated from the filtered power supply voltage, so to avoid the ripple and noise on the power supply to be introduced on the input of the integrator.

In this case, the duty cycle of the switching output signal stays identical with that of the input signal all along, thus full scale duty cycle range of input and output is achieved.

In one embodiment of the disclosure, the first order integrator of the negative feedback class-D amplifier unit 10 in the amplifier circuit 1 is replaced by a second order integrator for better performance.

Figure 2:
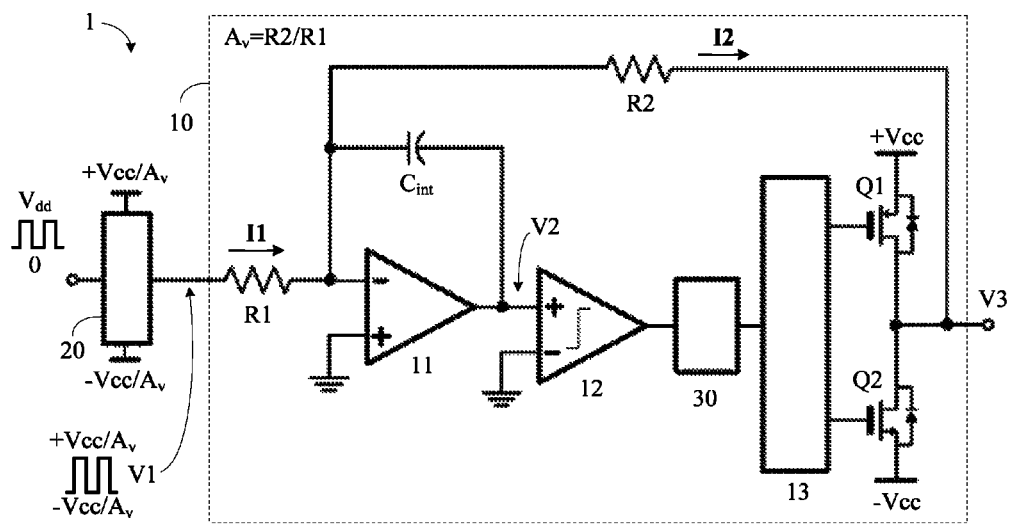
FIG. 2 illustrates an amplifier circuit according to another embodiment.

FIG. 2 illustrates an amplifier circuit 1 according to another embodiment. The amplifier circuit 1 as illustrated in FIG. 2 further comprises a delay unit 30 compared to the amplifier circuit 1 as illustrated in FIG. 1.

The delay unit 30 is configured to delay the switching output signal for the duration of 3 to 8 percent of the cycle period of the input signal. The delay unit 30 could be arranged between the comparator 12 and the power driver 13, or between the output feedback and the middle point of the upper transistor Q1 and the lower transistor Q2. It will be appreciated by those skilled in the art that the delay unit 30 should take the cycle period of the input signal or the cycle period of the switching output signal as one of the control parameters or input parameters.

Figure 3:
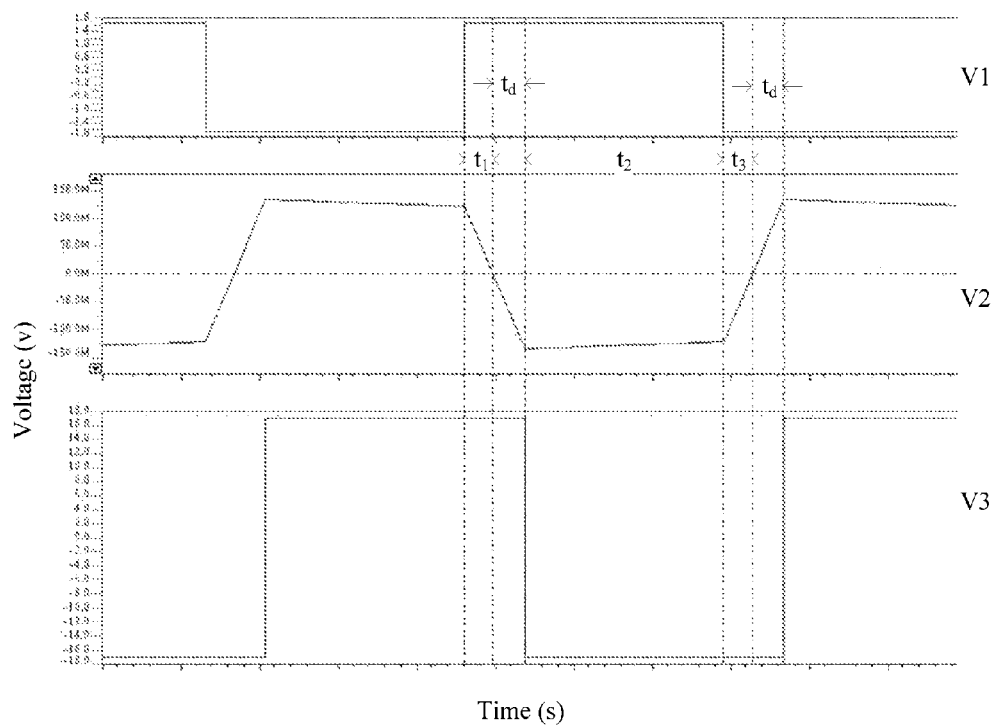
FIG. 3 illustrates the simulated waveforms of the amplifier circuit as illustrated in FIG. 2.

FIG. 3 illustrates the simulated waveforms of the amplifier circuit 1 as illustrated in FIG. 2. The three waveforms V1, V2 and V3 are detected from the input of the negative feedback class-D amplifier unit 10 (i.e., the shifted input signal), the output of the integrator (i.e., the input of the comparator 12), and the output of the negative feedback class-D amplifier unit 10 (i.e., the switching output signal), respectively. The output waveform of the integrator (V2) is represented as successive teeth, each of which is characterized by a sharp rising edge and a sharp falling edge both related to the charge current of (|I1|+|I2|), wherein I1 is the input current of the negative feedback class-D amplifier unit 10, and I2 is the feedback current of the negative feedback class-D amplifier unit 10. The sharp rising edge or the sharp falling edge is caused by the currents I1 and I2 with inverse phases, which occurs right after each phase step of the input signal. The voltage level of the front edge of each tooth of V2 is decided by the charge current (|I1|+|I2|↑) and the charge time $t_d$, i.e. the delay introduced by the delay unit 30.

In case that |I1|<|I2|, the ceiling of each tooth of the output of the integrator (V2) will drop with a slope related to the discharge current of (|I2|−|I1|). If the output of the integrator drops across the reference level, unexpected phase inversion may occurs. Advantageously, the unexpected phase inversion is avoid in this embodiment, since the delay $t_d$ is comparable with the cycle of the input signal, so that the voltage level of the front edge of each tooth of V2 is high enough.

In the case that the input signal and the switching output signal are both PWM signals, the delay duration of the delay unit 30 is of approximately 3 to 8 percent of the cycle period of the input PWM signal.

In the case that the input signal is a square wave signal with variable cycle period and the switching output signal is of the same kind, the delay duration of the delay unit 30 could be 3 to 8 percent of the minimum cycle period of the input square wave signal.

In this manner, unexpected spurs could be eliminated and the amplifier circuit could work more stably.

In one embodiment of the disclosure, the input signal and the switching output signal are both PWM signals, and the delay duration of the delay unit 30 of the amplifier circuit 1 is approximately 4 to 6 percent of the cycle period of the input PWM signal.

In another embodiment of this disclosure, an amplifier circuit 1 as illustrated in FIG. 2 further comprises a delay unit 30 configured to delay the switching output signal for a duration greater than T/(2+(|I1|+|I2|)/(|I2|−|I1|))], wherein T is the cycle of the switching output signal, and I1 is the input current of the negative feedback class-D amplifier unit 10, and I2 is the feedback current of the negative feedback class-D amplifier unit 10. The delay unit 30 could be arranged between the comparator 12 and the power driver 13, or between the output feedback and the middle point of the upper transistor Q1 and the lower transistor Q2. It will be appreciated by those skilled in the art that the delay unit 30 should take the cycle period of the input signal or the cycle period of the switching output signal as one of the control parameters or input parameters.

As illustrated in FIG. 3, the longer of the delay $t_d$, the higher is the amplitude of the integrator output. If the integrator output is high enough, the ceiling will not drop across the reference level, so that unexpected phase inversion will not occur. Thus, the $t_2$ needs to satisfy: $t_2*(|I2|-|I1|)/C_{int} < (t_d*(|I1|+|I2|)/C_{int})$. The worst case is that the input duty cycle is 100%. For example, the equation could be obtained that $t_1+t_2+t_d=T$, namely, $t_2=T-t_d-t_1<t_d*(|I1|+|I2|)/(|I2|-|I1|)$.

If the input duty cycle is about 100%, the approximation $t_1 \approx t_d$ could be applied to the above inequality. Therefore, the delay $t_d$ needs to satisfy: $T/(2+(|I1|+|I2|)/(|I2|-|I1|))$. In this condition, advantageously, unexpected phase inversion is avoided in this embodiment.

The embodiments as illustrated in FIG. 1 and FIG. 2 relate to the negative feedback class-D amplifier unit 10 with half-bridge structure. In some other embodiments of the disclosure, the negative feedback class-D amplifier unit 10 of the amplifier circuit 1 comprises a full-bridge structure. Still in some other embodiments of the disclosure, the negative feedback class-D amplifier unit 10 of the amplifier circuit 1 comprises a multiple channel structure.

In some other embodiments, the output stage of the negative feedback class-D amplifier unit 10 could also be powered with unipolar bias voltage Vcc. Thus, the peak-to-peak amplitude of the switching output signal is Vcc. In the case that the peak-to-peak amplitude of the input signal is Vdd and the voltage gain (i.e. feedback gain) of the negative feedback class-D amplifier unit 10 is $A_V$, the level shifter 20 should keep a voltage gain of $Vcc/(A_V \times V_{dd})$, so that the duty cycle of the switching output signal is equal to the duty cycle of the input signal, thus the full scale duty cycle range of input and output could be achieved in the amplifier circuit 1 as the open-loop digital class-D.

Figure 4:
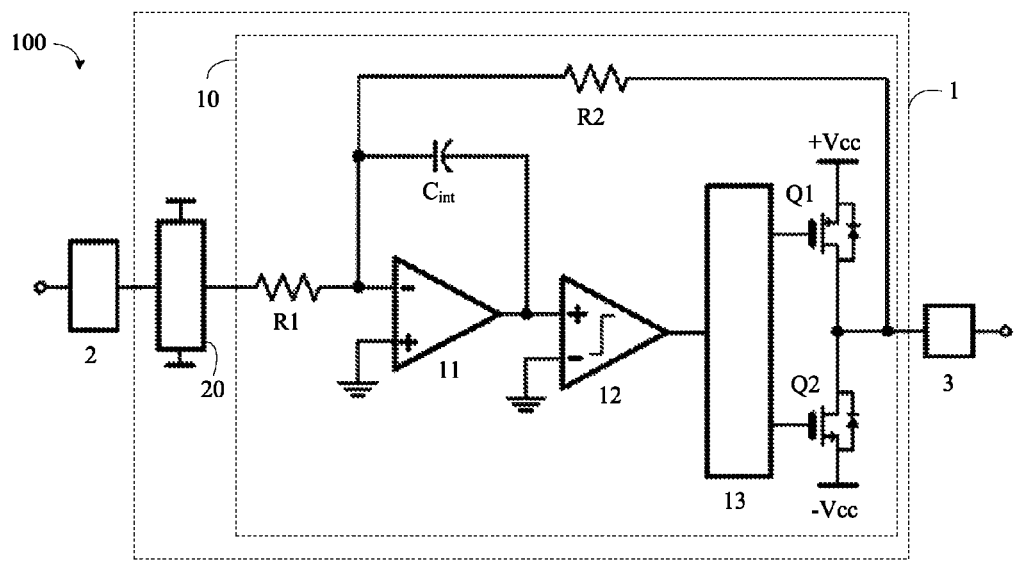
FIG. 4 illustrates an audio amplifier circuit according to an embodiment.

FIG. 4 illustrates an audio amplifier circuit 100 according to an embodiment. The audio amplifier circuit 100 comprises a PWM modulator 2, a digital amplifier circuit 1 as illustrated in FIG. 1, and a low pass filter 3.

The PWM modulator 2 is configured to convert an analog audio signal into a PWM signal. Generally, the analog audio signal is carried in the duty cycle of the PWM signal.

The digital amplifier circuit 1 comprises a negative feedback class-D amplifier unit 10 configured to receive the PWM signal and to generate an switching output signal, and a level shifter 20, configured to shift the PWM signal to have a shifted amplitude proportional to the peak-to-peak amplitude of the switching output signal. With reference to the above embodiments explained in conjunction with FIG. 1, it will be appreciated by those skilled in the art that the duty cycle of the switching output signal is proportional to that of the input PWM signal, therefore the analog signal carried by the duty cycle could be regenerated without distortion.

The low pass filter 3 is configured to filter the switching output signal so as to output a regenerative analog audio signal. As is appreciated, after the switching output signal goes through a low pass filter, high frequency components will be filtered and the analog audio signal carried in the duty cycle of the switching output signal will be recovered.

In one embodiment of the disclosure, the voltage gain of the level shifter 20 is configured to be approximately equal to a ratio between the peak-to-peak amplitude of the switching output signal and the product of the amplitude of the input signal and the voltage gain of the negative feedback class-D amplifier unit. With reference to the above embodiments related to the amplifier circuit 1, it will be appreciated by those skilled in the art that the duty cycle of the switching output signal is equal to that of the input PWM signal and full scale duty cycle range of input PWM and output PWM signal is achieved.

In one embodiment of the disclosure, the audio amplifier circuit 100 further comprises a delay unit 30 configured to delay the switching output signal for the duration of 3 to 8 percent of the cycle period of the input PWM signal. As is appreciated, the delay unit 30 could be arranged between the comparator 12 and the power driver 13, or between the output feedback and the middle point of the upper transistor Q1 and the lower transistor Q2. It will be appreciated by those skilled in the art that the delay unit 30 should take the cycle period of the PWM signal as one of the control parameters or input parameters. With reference to the above embodiments of the digital amplifier circuit 1 explained in conjunction with FIG. 2 and FIG. 3, by means of the delay unit 30, unexpected phase inversion to the switching output signal of the digital amplifier circuit 1 could be eliminated and the audio amplifier circuit 100 could work more stably.

In another embodiment of the disclosure, the audio amplifier circuit 100 further comprises a delay unit 30 configured to delay the switching output signal for a duration greater than $T/(2+(|I1|+|I2|)/(|I2|-|I1|))$, wherein is the cycle of the switching output signal, and I1 is the input current of the negative feedback class-D amplifier unit 10, and I2 is the feedback current of the negative feedback class-D amplifier unit 10. It will be appreciated by those skilled in the art that the delay unit 30 should take the cycle period of the input signal or the cycle period of the switching output signal as one of the control parameters or input parameters. In this condition, advantageously, unexpected phase inversion is avoided in this embodiment.

The embodiment as illustrated in FIG. 4 relates to the audio amplifier circuit 100 including the negative feedback class-D amplifier unit 10 with half-bridge structure. In some other embodiments of the disclosure, the negative feedback class-D amplifier unit 10 of the audio amplifier circuit 100 comprises a full-bridge structure. Still in some other embodiments of the disclosure, the negative feedback class-D amplifier unit 10 of the audio amplifier circuit 100 comprises a multiple channel structure.

Figure 5:
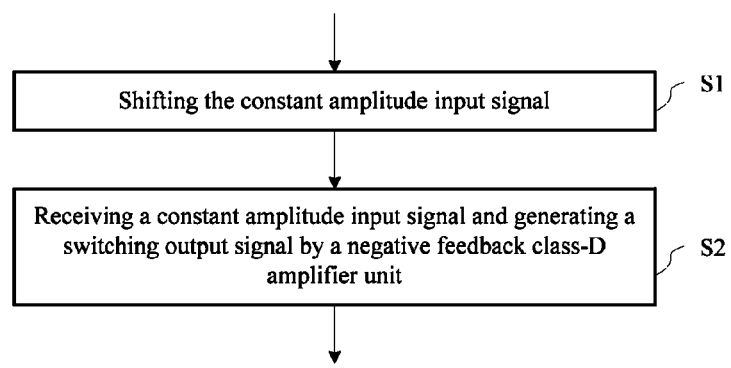
FIG. 5 illustrates the flowchart of a method for amplifying a digital signal according to an embodiment.

FIG. 5 illustrates the flowchart of a method of amplifying a digital signal according to an embodiment. The method comprises two steps S1 and S2.

In step S2, an input signal (referenced as a constant amplitude input signal in that the switching signal maximum value is constant) is received by a negative feedback class-D amplifier unit and a switching output signal is generated therewith. As is appreciated, the step S2 could be performed by the negative feedback class-D amplifier unit 10 as explained above.

In step S1, the amplitude of the input signal is shifted to a value proportional to the peak-to-peak amplitude of the switching output signal of the negative feedback class-D amplifier circuit. As is appreciated, the step S1 could be performed by the level shifter 20 as explained above. In this manner, the duty cycle of the switching output signal is proportional to that of the input signal and the analog signal carried by the duty cycle could be regenerated without distortion.

In one embodiment of the method of amplifying a digital signal, in the step S1, the input signal is shifted to a value approximately equal to a ratio between the peak-to-peak amplitude of the switching output signal and the voltage gain of the negative feedback class-D amplifier unit. With reference to the above embodiments of the amplifier circuit 1 explained in conjunction with FIG. 1 to FIG. 3, in this manner, the duty cycle of the switching output signal is equal to that of the input signal and full scale duty cycle range of input and output is achieved.

In one embodiment of the method of amplifying a digital signal, the input signal and the switching output signal are both PWM signal. As is appreciated, the method is likely to be used in an audio signal amplifying process.

In one embodiment of the disclosure, the method of amplifying a digital signal further comprises a step: delaying the switching output signal for the duration of 3 to 8 percent of the input signal period. As is appreciated, the delaying step could be performed by the delay unit 30 as explained above.

In the case that the input signal and the switching output signal are both PWM signals, the delay duration is of 3 to 8 percent of the cycle period of the input PWM signal.

In the case that the input signal is a square wave signal with variable cycle period and the switching output signal is of the same kind, the delay duration could be 3 to 8 percent of the minimum cycle period of the input square wave signal.

In this manner, unexpected spurs in the switching output signal could be eliminated and the negative feedback class-D amplifier unit could work more stably.

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits It will also be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. An amplifier circuit, comprising:
an amplifier unit configured to receive a switching input signal and to generate a switching output signal; and
a level shifter configured to shift an input signal to generate the switching input signal having a shifted amplitude proportional to a peak-to-peak amplitude of the switching output signal;
wherein an amplitude of the input signal is shifted by the level shifter to a value approximately equal to a ratio of an amplitude of the switching output signal divided by an input to output voltage gain applied by the amplifier unit to generate the switching output signal from the switching input signal.

2. The amplifier circuit according to claim 1, wherein the input signal and the switching output signal are each a PWM signal.

3. The amplifier circuit according to claim 1, wherein the amplifier unit is of negative feedback class-D amplifier structure.

4. The amplifier circuit according to claim 3, wherein the negative feedback class-D amplifier unit comprises a first order integrator.

5. The amplifier circuit according to claim 3, wherein the negative feedback class-D amplifier unit comprises a second order integrator.

6. The amplifier circuit according to claim 1, wherein the amplifier unit comprises a delay unit configured to delay the switching output signal for a duration of approximately 3 to 8 percent of a cycle of the input signal.

7. The amplifier circuit according to claim 6, wherein the delay duration is approximately 4 to 6 percent of a cycle of the input signal.

8. The amplifier circuit according to claim 3, wherein the negative feedback class-D amplifier unit comprises a delay unit configured to delay the switching output signal for a duration greater than $T/(2+(|I1|+|I2|)/(|I2|-|I1|))]$, wherein T is the cycle of the switching output signal, and I1 is the input current of the negative feedback class-D amplifier unit, and I2 is the feedback current of the negative feedback class-D amplifier unit.

9. The amplifier circuit according to claim 3, wherein the negative feedback class-D amplifier unit comprises a full-bridge.

10. An audio amplifier circuit, comprising:
a PWM modulator configured to convert an analog audio signal into a PWM signal having a first amplitude;
a digital amplifier circuit, comprising:
a negative feedback class-D amplifier unit configured to receive a level shifted PWM signal and generate a switching output signal; and
a level shifter configured to shift the PWM signal from the first amplitude to a shifted amplitude having a value approximately equal to a ration between the a peak-to-peak amplitude of the switching output signal and a voltage gain of the negative feedback class-D amplifier unit; and
a low pass filter configured to filter the switching output signal so as to output a regenerative analog audio signal.

11. The audio amplifier circuit according to claim 10, further comprising a delay unit configured to delay the switching output signal for the duration of 3 to 8 percent of a cycle of the PWM signal.

12. The audio amplifier circuit according to claim 10, further comprising a delay unit configured to delay the switching output signal for a duration greater than $T/(2+(|I1|+|I2|)/(|I2|-|I1|))$, wherein T is the cycle of the switching output signal, and I1 is the input current of the negative feedback class-D amplifier unit, and I2 is the feedback current of the negative feedback class-D amplifier unit.

13. The audio amplifier circuit according to claim 10, wherein the negative feedback class-D amplifier unit comprises a full-bridge.

14. A method comprising:
negative feedback class-D amplification of a shifted input signal to generate a switching output signal;
shifting an amplitude of an input signal to a value proportional to the peak-to-peak amplitude of the switching output signal;
wherein shifting comprises shifting the amplitude of the input signal to a value approximately equal to a ratio between the peak-to-peak amplitude of the switching output signal and a voltage gain of the negative feedback class-D amplification.

15. The method according to claim 14, wherein the input signal and the switching output signal are both PWM signal.

16. The method according to claim 14, further comprising:
delaying the switching output signal for the duration of approximately 3 to 8 percent of a cycle of the input signal cycle.

17. A circuit, comprising:
a level shifting circuit having a first input configured to receive an digital input signal and a first output configured to output a digital level shifted signal, said level shifter connected between a first positive supply voltage and a second negative supply voltage; and
an amplifier circuit having a second input configured to receive the digital level shifted signal and a second output configured to output a digital output signal, said amplifier circuit having a gain between second input and second output and said amplifier circuit connected between a second positive supply voltage and a second negative supply voltage;
wherein the first positive supply voltage substantially equals the second positive supply voltage divided by the gain; and
wherein the first negative supply voltage substantially equals the second negative supply voltage divided by the gain.

18. The circuit of claim 17, wherein the amplifier circuit comprises a negative feedback class-D amplifier unit.

19. The circuit of claim 17, wherein the amplifier circuit comprises:
an integrator having an input configured to receive the digital level shifted signal;
a comparator configured to compare an output of the integrator to a reference voltage; and
a push-pull transistor output driver circuit coupled between the second positive supply voltage and second negative supply voltage.

20. The circuit of claim 19, wherein the amplifier circuit further comprises a delay circuit coupled between an output of the comparator and an input of the push-pull transistor output driver circuit.

21. The circuit of claim 19, wherein the reference voltage is between the second positive supply voltage and the second negative supply voltage.

* * * * *

UNITED STATES PATENT AND TRADEMARK OFFICE
CERTIFICATE OF CORRECTION

| | | |
|---|---|---|
| PATENT NO. | : 8,525,593 B2 | Page 1 of 1 |
| APPLICATION NO. | : 13/313328 | |
| DATED | : September 3, 2013 | |
| INVENTOR(S) | : Qiyu Liu | |

It is certified that error appears in the above-identified patent and that said Letters Patent is hereby corrected as shown below:

In the Claims:

At column 9, claim number 10, line number 54, please replace the word [ration] with -- ratio --.

Signed and Sealed this
Twenty-sixth Day of November, 2013

Margaret A. Focarino
*Commissioner for Patents of the United States Patent and Trademark Office*